(12) United States Patent
Baek et al.

(10) Patent No.: US 12,322,607 B2
(45) Date of Patent: Jun. 3, 2025

(54) WAFER PROCESSING APPARATUS AND WAFER PROCESSING METHOD

(71) Applicant: ZEUS CO., LTD., Hwaseong-si (KR)

(72) Inventors: Seung Dae Baek, Hwaseong-si (KR);
Kuem Dong Heo, Ansan-si (KR);
Kang Won Lee, Guri-si (KR); Woon Kong, Cheonan-si (KR)

(73) Assignee: ZEUS CO., LTD., Hwaseong-si (KR)

(*) Notice: Subject to any disclaimer, the term of this patent is extended or adjusted under 35 U.S.C. 154(b) by 215 days.

(21) Appl. No.: 17/725,054

(22) Filed: Apr. 20, 2022

(65) Prior Publication Data

US 2022/0344177 A1    Oct. 27, 2022

(30) Foreign Application Priority Data

Apr. 21, 2021  (KR) .................. 10-2021-0051544

(51) Int. Cl.
*H01L 21/67* (2006.01)
*H01L 21/687* (2006.01)

(52) U.S. Cl.
CPC .... *H01L 21/67051* (2013.01); *H01L 21/6708* (2013.01); *H01L 21/687* (2013.01)

(58) Field of Classification Search
CPC .......... H01L 21/67051; H01L 21/6708; H01L 21/687; H01L 21/67253; H01L 21/02057; H01L 21/02076; H01L 21/30604; B08B 3/02; B08B 3/08; B08B 3/14; B08B 5/04; B05C 5/0208
See application file for complete search history.

(56) References Cited

U.S. PATENT DOCUMENTS 5,871,584 A    2/1999  Tateyama et al.
2013/0168331 A1    7/2013  Beggs

FOREIGN PATENT DOCUMENTS

| CN | 101150047 | 3/2008 | |
| CN | 105390418 | 3/2016 | |
| CN | 112103208 | 12/2020 | |
| JP | H0845832 A * | 2/1996 | ......... B05C 11/1039 |
| JP | 2015-138962 | 7/2015 | |
| KR | 10-2008-0079390 | 9/2008 | |
| KR | 10-2009-0047262 | 5/2009 | |
| KR | 10-2009-0047266 | 5/2009 | |
| KR | 10-2020-0045071 | 5/2020 | |
| TW | 201039934 | 11/2010 | |

OTHER PUBLICATIONS

JPH0845832A; Feb. 1996; Tateyama et al.; Machine Translation (Year: 1996).*

* cited by examiner

*Primary Examiner* — Bejamin L Osterhout
(74) *Attorney, Agent, or Firm* — KILE PARK REED & HOUTTEMAN PLLC (57) ABSTRACT

A wafer processing apparatus of the present invention includes a suction nozzle configured to suction sludge from a cup housing, a flow line connected to the suction nozzle such that the sludge and a chemical solution flow therein, a suction tank connected to the flow line such that the sludge and the chemical solution flow thereto, and an ejector installed on a flow line to generate suction pressure in the suction nozzle and the flow line.

10 Claims, 6 Drawing Sheets

WAFER PROCESSING APPARATUS AND WAFER PROCESSING METHOD

CROSS-REFERENCE TO RELATED APPLICATION

This application claims the benefit under 35 U.S.C. § 119(a) of Korean Patent Application No. 10-2021-0051544, filed on Apr. 21, 2021 in the Korean Intellectual Property Office, the entire disclosure of which is incorporated herein by reference for all purposes.

BACKGROUND

Technical Field

The present invention relates to a wafer processing apparatus and a wafer processing method, and more particularly, to a wafer processing apparatus capable of preventing a substrate of being contaminated and preventing a flow line from being clogged, and a wafer processing method.

Discussion of the Background

In general, in a semiconductor process, an etching process of etching substrates, a singulation process of sawing the substrates into a plurality of dies, and a cleaning process of cleaning the substrates are performed. A wafer processing apparatus is used in the wafer etching process or the cleaning process.

The wafer processing apparatus includes a cup housing, a rotary chuck unit which is rotatably installed in the cup housing and on which a substrate is mounted, and a spray nozzle which sprays a chemical solution onto the substrate. While the rotary chuck unit rotates, the spray nozzle sprays the chemical solution onto the substrate.

However, conventionally, when foreign materials remain on a surface of a substrate after the processing of the substrate is completed, defects of the substrate may occur in a subsequent process.

In addition, after a substrate processing process is ended, a chemical solution and sludge remaining in a spray nozzle fall on the substrate, the substrate may be contaminated.

A background technique of the present invention is disclosed in Korean Patent Publication No. 2020-0045071 (published on May 4, 2020, and titled "Liquid supply nozzle and wafer processing apparatus).

SUMMARY OF THE INVENTION

The present invention is directed to providing a wafer processing apparatus capable of preventing a substrate of being contaminated and preventing a flow line from being clogged, and a wafer processing method.

According to an aspect of the present invention, there is provided a wafer processing apparatus including a suction nozzle configured to suction sludge from a cup housing, a flow line connected to the suction nozzle such that the sludge and a chemical solution flow therein, a suction tank connected to the flow line such that the sludge and the chemical solution flow thereto, and an ejector installed on a flow line to generate suction pressure in the suction nozzle and the flow line.

The ejector may include an ejector body into which the sludge and the chemical solution suctioned into the flow line flow, and a gas supply unit connected to the ejector body to supply a gas to the ejector body.

The suction tank may include a suction tank body connected to the flow line, a filter unit disposed inside the suction tank body to filter the sludge discharged from the flow line, and a drain unit connected to the suction tank body to discharge the chemical solution filtered by the filter unit.

The filter unit may include a plurality of filters stacked between the flow line and the drain unit, and the plurality of filters may have meshes which become smaller toward the drain unit.

The wafer processing apparatus may further include an overflow line connected to the suction tank body and the drain unit.

The overflow line may be connected to a portion above the filter unit in the suction tank.

The wafer processing apparatus may further include an overflow detection unit configured to detect that the chemical solution of the suction tank body flows into the overflow line.

The wafer processing apparatus may further include a discharge line connected to the suction tank to discharge a chemical fume and a gas from the suction tank.

The wafer processing apparatus may further include a spray nozzle configured to spray the chemical solution onto a substrate in the cup housing, and when the spray nozzle sprays the chemical solution onto the substrate, the suction nozzle may suction the sludge floating in the chemical solution.

After a substrate processing process is ended, the ejector may generate suction pressure in the suction nozzle and the flow line for a preset time.

According to another aspect of the present invention, there is provided a wafer processing method including supplying a chemical solution to a cup housing and processing a substrate, generating, by an ejector, suction pressure in a suction nozzle and a flow line, suctioning, by the suction nozzle, sludge floating at an upper side of the chemical solution and the chemical solution, and allowing the sludge and the chemical solution flowing in the flow line to flow into a suction tank.

The generating of the suction pressure in the suction nozzle and the flow line may include supplying, by the ejector, a gas to the flow line.

The allowing of the sludge and the chemical solution flowing in the flow line to flow into the suction tank may include filtering, by a filter unit, the chemical solution flowing into the suction tank and then discharging the filtered chemical solution through a drain unit, and discharging a chemical fume and the gas generated in the suction tank through a discharge line.

The wafer processing method may further include detecting, by an overflow detection unit, that the chemical solution overflows in the suction tank, and when overflow of the chemical solution is detected by the overflow detection unit, performing, by a control unit, control the chemical solution not to be supplied to the cup housing.

The wafer processing method may further include generating, by the ejector, suction pressure in the suction nozzle and the flow line for a preset time period after a substrate processing process is ended.

DETAILED DESCRIPTION OF EXEMPLARY EMBODIMENTS

Hereinafter, embodiments of a wafer processing apparatus and a wafer processing method according to the present invention will be described with reference to the accompanying drawings. In describing the wafer processing apparatus and the wafer processing method, thickness of lines or sizes of components shown in the drawings may be exaggerated for the sake of convenience and clarity in description. Furthermore, terms used herein are defined by taking functions of the present invention into account and may be changed according to a custom or the intent of a user or an operator. Accordingly, the terminologies should be defined based on the following overall description of the present specification.

Figure 1:
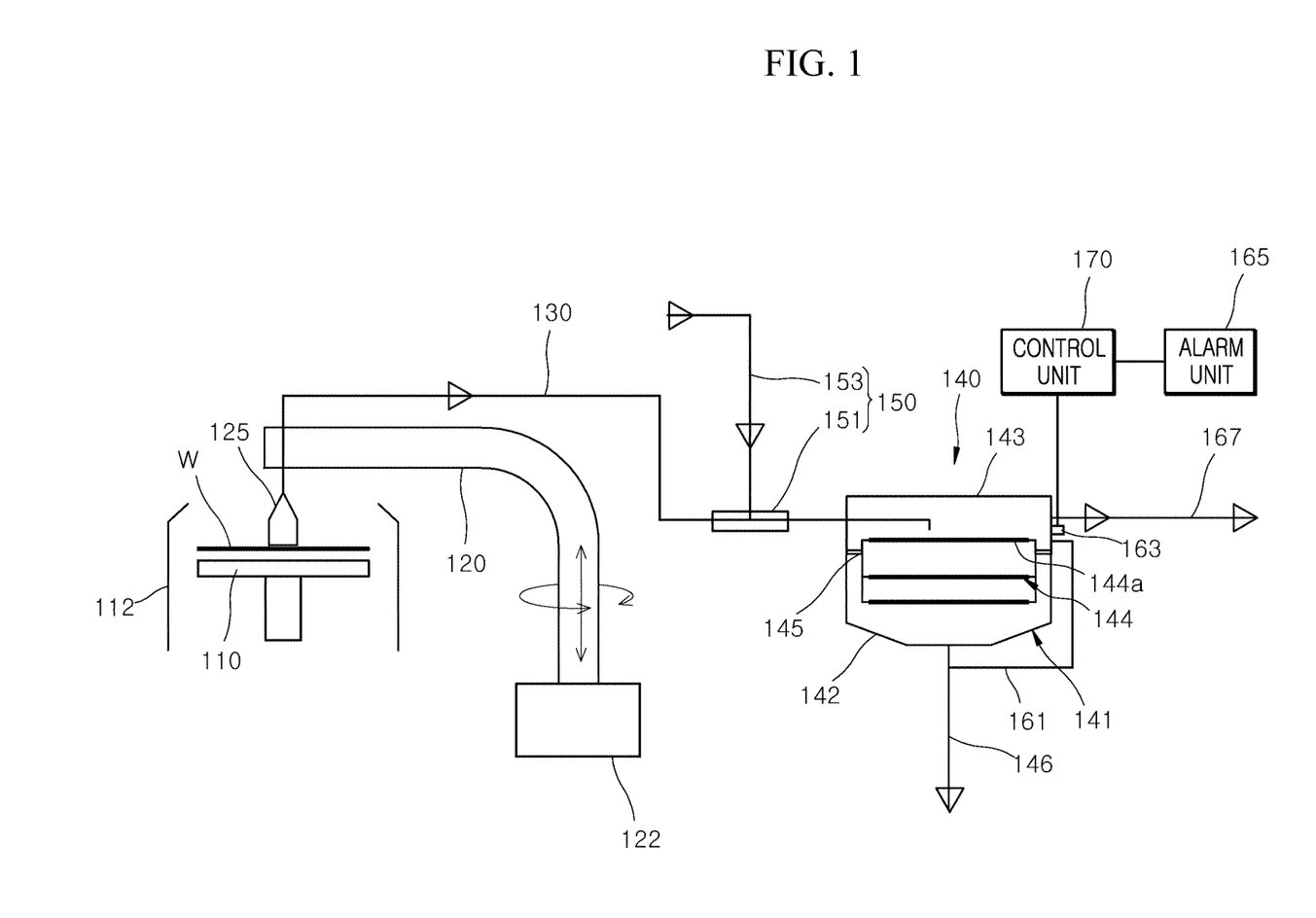
FIG. 1 is a schematic view illustrating a wafer processing apparatus according to one embodiment of the present invention.
Figure 2:
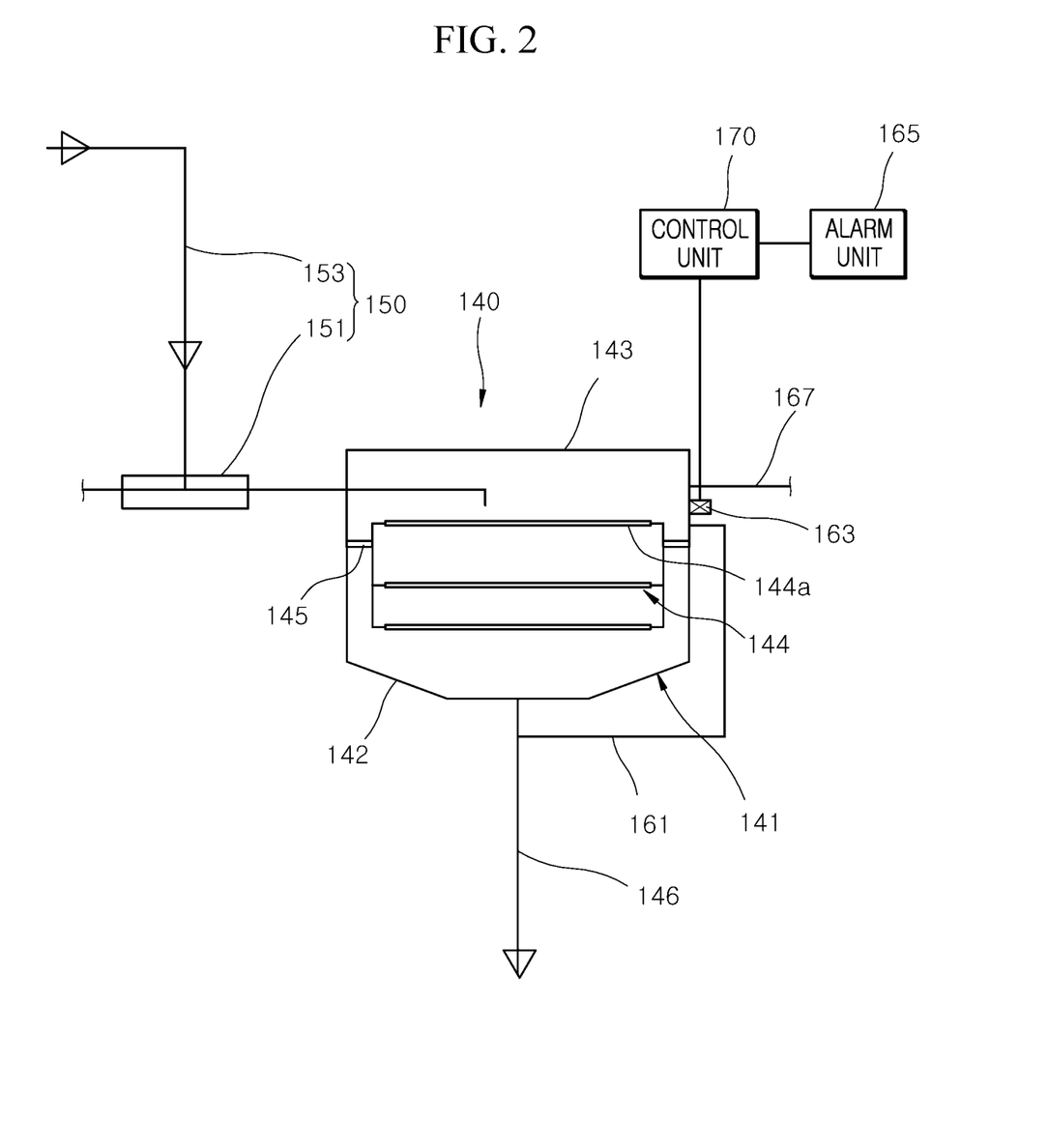
FIG. 2 is a schematic enlarged view illustrating a suction tank of the wafer processing apparatus according to one embodiment of the present invention.
Figure 3:
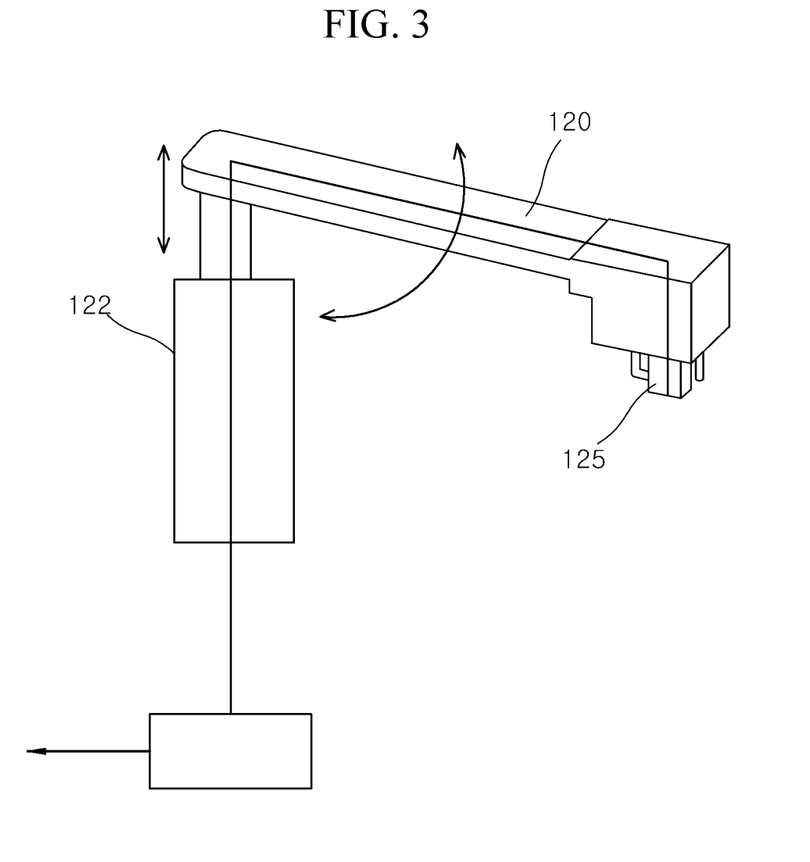
FIG. 3 is a schematic view illustrating a nozzle arm in the wafer processing apparatus according to one embodiment of the present invention.
Figure 4:
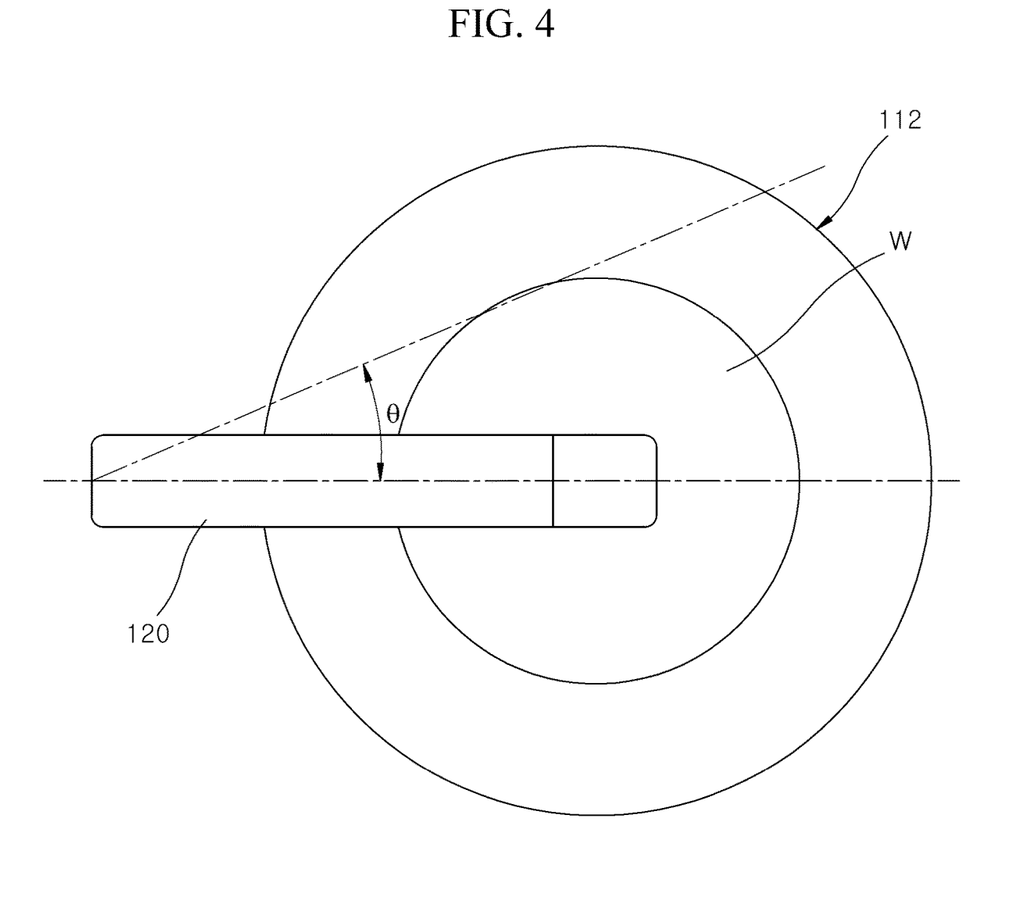
FIG. 4 is a schematic view illustrating a turning angle of the nozzle arm in the wafer processing apparatus according to one embodiment of the present invention.
Figure 5:
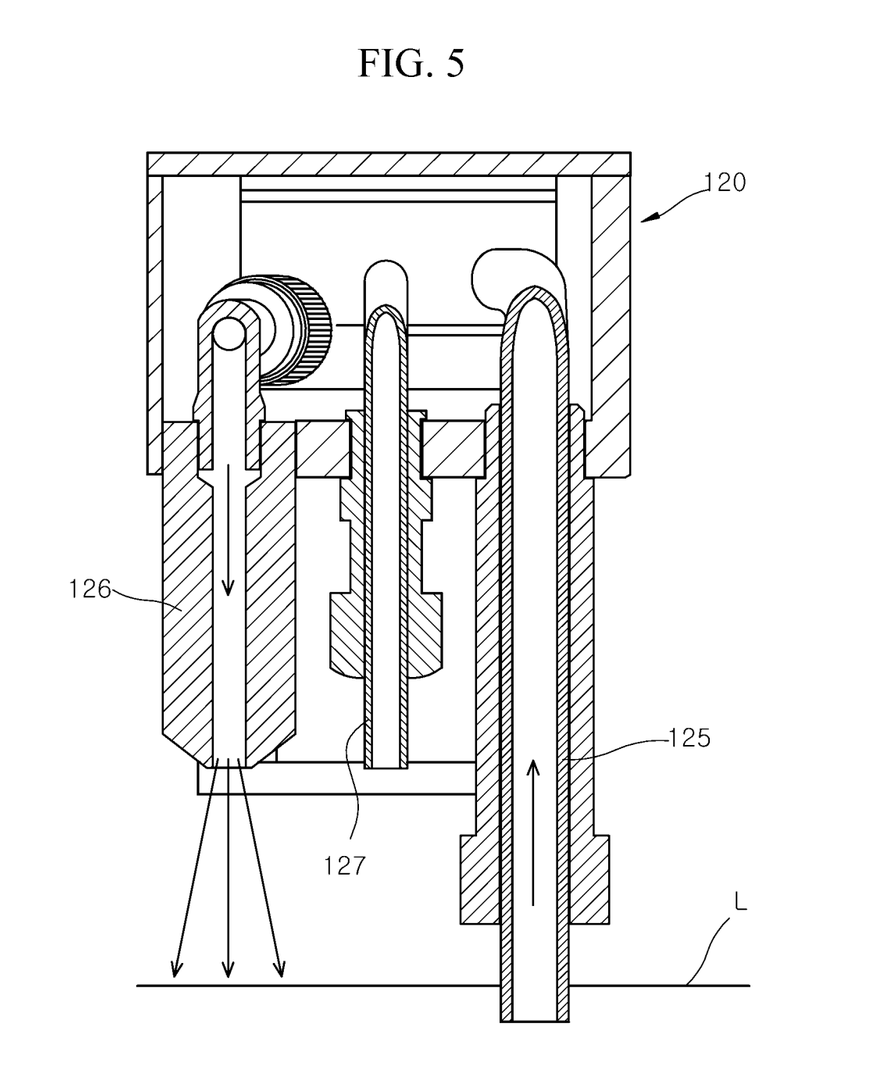
FIG. 5 is a schematic view illustrating a suction nozzle and spray nozzles in the wafer processing apparatus according to one embodiment of the present invention.

FIG. 1 is a schematic view illustrating a wafer processing apparatus according to one embodiment of the present invention. FIG. 2 is a schematic enlarged view illustrating a suction tank of the wafer processing apparatus according to one embodiment of the present invention. FIG. 3 is a schematic view illustrating a nozzle arm in the wafer processing apparatus according to one embodiment of the present invention. FIG. 4 is a schematic view illustrating a turning angle of the nozzle arm in the wafer processing apparatus according to one embodiment of the present invention. FIG. 5 is a schematic view illustrating a suction nozzle and spray nozzles in the wafer processing apparatus according to one embodiment of the present invention.

Referring to FIGS. 1 to 5, a wafer processing apparatus 100 according to one embodiment of the present invention includes a suction nozzle 125, a flow line 130, a suction tank 140, and an ejector 150.

A rotary chuck unit 110 is rotatably installed inside a cup housing 112. A substrate W such as a wafer is mounted on the rotary chuck unit 110. The substrate W may be in a state in which a plurality of dies (not shown) are sawn in the form of a matrix. Foreign materials may remain in gaps between the plurality of dies.

A nozzle arm 120 is installed outside the cup housing 112. The nozzle arm 120 is connected to a driving unit 122. The nozzle arm 120 is moved upward or downward with respect to the cup housing 112 by the driving unit 122 and is installed to be rotatable from the outside to the inside of the cup housing 112.

The suction nozzle 125 and spray nozzles 126 and 127 are installed in the nozzle arm 120. The spray nozzles 126 and 127 include a first spray nozzle 126 and a second spray nozzle 127. The suction nozzle 125 is immersed in a chemical solution to suction the chemical solution and sludge accommodated in the cup housing 112. In addition, the first spray nozzle 126 and the second spray nozzle 127 are disposed to be spaced apart from the chemical liquid by a certain height so as to spray the chemical liquid onto the substrate W mounted on the rotary chuck unit 110. The first spray unit 126 sprays a chemical solution, in which pure water and nitrogen are mixed, onto the substrate W. The second spray nozzle 127 sprays a chemical solution, in which nitrogen is not mixed, onto the substrate W. When the substrate W is processed by spraying a chemical solution from one of the first spray nozzle 126 and the second spray nozzle 127, the suction nozzle 125 suctions sludge floating in the chemical solution.

The chemical solution may be variously changed according to a processing process of the substrate W, a processing speed of the substrate W, and a material of the substrate W.

After the substrate W is mounted on the rotary chuck unit 110, the nozzle arm 120 is moved upward from the cup housing 112. The first spray nozzle 126 or the second spray nozzle 127 sprays a chemical solution onto the substrate W. As the chemical solution is sprayed onto the substrate W, foreign materials remaining in the gaps between the dies float by rising to an upper side of the chemical solution. Foreign materials remaining on the substrate W will be referred to as sludge.

The flow line 130 is connected to the suction nozzle 125 such that sludge and a chemical solution flow therein. When suction pressure is generated in the flow line 130, the suction nozzle 125 suctions sludge floating at an upper side of the chemical solution. The sludge and chemical solution suctioned into the suction nozzle 125 flow in the flow line 130.

The suction tank 140 is connected to the flow line 130 such that the sludge and the chemical solution flow thereto. Negative pressure lower than atmospheric pressure is formed inside the suction tank 140 to suction the sludge and the chemical solution.

The ejector 150 is installed on the flow line 130 to form suction pressure in the suction nozzle 125 and the flow line 130. Since the ejector 150 is installed on the flow line 130, the suction nozzle 125 may be expanded as compared with a structure in which the ejector 150 is installed on the suction nozzle 125. In addition, the size of the ejector 150 may be increased. Accordingly, it is possible to prevent the suction nozzle 125 and the ejector 150 from being clogged by sludge.

After a substrate processing process is ended, the ejector 150 may be driven for a preset time. For example, after the substrate processing process is ended, the ejector 150 is driven for about 3 to 5 minutes. Therefore, sludge and a chemical solution remaining in the suction nozzle 125 and the flow line 130 are completely discharged to the suction tank 140, the substrate W can be prevented from being contaminated due to the chemical solution falling from the suction nozzle 125.

The ejector 150 includes an ejector body 151 and a gas supply unit 153. Sludge and a chemical solution suctioned into the flow line 130 flow into the ejector body 151. The gas supply unit 153 is connected to the ejector body 151 to supply a gas to the ejector body 151. As the gas, hydrogen gas, which is explosive but prevents a chemical bond to a chemical solution, is provided. Since the gas supply unit 153 supplies the gas to the ejector body 151, suction pressure lower than atmospheric pressure is generated inside the ejector body 151. In addition, since the gas of the ejector body 151 flows into the suction tank 140 and then is discharged, negative pressure is generated in the suction tank 140.

The suction tank 140 includes a suction tank body 141, a filter unit 144, and a drain unit 146.

The suction tank body 141 is connected to the flow line 130. A chemical solution, sludge, and a gas flowing in the flow line 130 flow into the suction tank body 141. As a gas is discharged through a discharge line 167, negative pressure lower than atmospheric pressure is formed in the suction tank body 141. A bottom surface of the suction tank body 141 is inclined toward a center thereof such that a chemical solution is collected.

A window 143 is installed on the suction tank body 141 so that the inside of the suction tank may be viewed from the outside. Accordingly, an operator can check an internal state of the suction tank body 141 by looking at the window 143.

The filter unit 144 is disposed inside the suction tank body 141 to filter sludge discharged from the flow line 130. The filter unit 144 is supported by a support 145.

The filter unit 144 includes a plurality of filters 144a stacked between the flow line 130 and the drain unit 146, and the plurality of filters 144a have meshes which become smaller toward the drain unit 146. Accordingly, sludge with large particles is filtered by the filter 144a at an upper side, and sludge with small particles is filtered by the filter 144a at a lower side. The plurality of filters 144a are detachably installed at the support 145. Therefore, when the filter 144a is clogged, the filter 144a is separated from the support 145, the filter 144a may be cleaned and then may be installed at the support 145 again.

The drain unit 146 is connected to the suction tank body 141 to discharge a chemical solution filtered by the filter unit 144. The drain unit 146 is connected to the lowest portion of a bottom surface 142 of the suction tank body 141. The drain unit 146 may be connected to a chemical collection unit (not shown) or the cup housing 112. Since the drain unit 146 is connected to the lowest portion of the bottom surface 142 of the suction tank body 141, it is possible to prevent a chemical solution from remaining inside the suction tank body 141.

The wafer processing apparatus 100 further includes an overflow line 161 connected to the suction tank body 141 and the drain unit 146. The overflow line 161 is connected to a portion above the filter unit 144 in the suction tank 140. When the filter unit 144 is clogged by sludge, a chemical solution may overflow to an upper side of the suction tank body 141. In this case, the overflowing chemical solution is discharged to the drain unit 146 through the overflow line 161.

The wafer processing apparatus 100 further includes an overflow detection unit 163 which detects that a chemical solution of the suction tank body 141 flows into the overflow line 161. The overflow detection unit 163 may be a water level sensor for detecting a level of a chemical solution. When the overflow detection unit 163 detects that the chemical solution overflows, the overflow detection unit 163 transmits a signal to a control unit 170. The control unit 170 controls an alarm unit 165 to generate an alarm and controls the first spray nozzle 126 and the second spray nozzle 127 to stop the supply of the chemical solution. The operator opens the suction tank body 141 to replace or clean the filter unit 144.

The wafer processing apparatus 100 further includes a discharge line 167 connected to the suction tank 140 to discharge a chemical fume and a gas inside the suction tank 140. The discharge line 167 may be connected to a collection device (not shown). When a chemical solution evaporates, a chemical fume is generated, and the chemical fume and a gas are discharged through the discharge line 167 so that negative pressure is formed inside the suction tank 140. Accordingly, a chemical solution, sludge, and a gas of the flow line 130 are suctioned into the suction tank 140.

A wafer processing method of the wafer processing apparatus according to one embodiment of the present invention configured as described above will be described.

Figure 6:
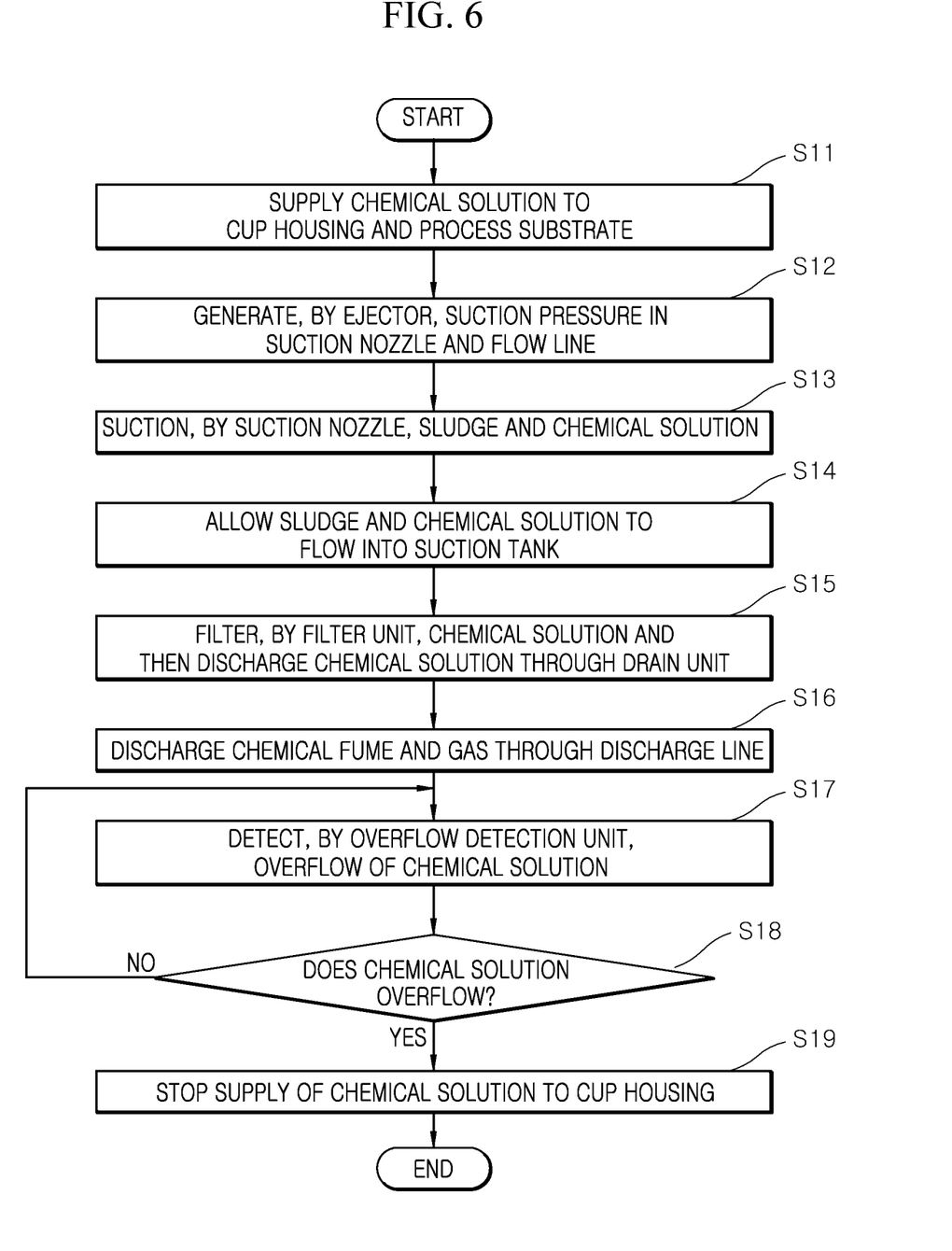
FIG. 6 is a schematic diagram illustrating a wafer processing method according to one embodiment of the present invention.

FIG. 6 is a schematic diagram illustrating a wafer processing method according to one embodiment of the present invention.

Referring to FIG. 6, spray nozzles 126 and 127 supply a chemical solution to a cup housing 112, and as a rotary chuck unit 110 rotates, a substrate W is processed (S11). In this case, end portions of the spray nozzles 126 and 127 are spaced apart from a surface of the chemical solution by a certain height, and an end portion of a suction nozzle 125 is slightly immersed in an upper side of the chemical solution. A nozzle arm 120 repeatedly turns within a certain angle θ such that the spray nozzles 126 and 127 spray the chemical solution in a radial direction of the substrate W. As the chemical solution is sprayed onto the entirety of the rotating substrate W, foreign materials or the like stuck in gaps between dies of the substrate W or foreign materials or the like attached to the substrate W are separated and then float at an upper side of the chemical solution.

An ejector 150 generates suction pressure in the suction nozzle 125 and a flow line 130 (S12). In this case, when the ejector 150 supplies a gas to the flow line 130, suction pressure is generated in the flow line 130.

Sludge floating at the upper side of the chemical solution and the chemical solution are suctioned by the suction nozzle 125 (S13). The sludge and the chemical solution flow along the flow line 130.

The sludge, chemical solution, and gas flowing in the flow line 130 flow into a suction tank 140 (S14). As the gas is discharged through a discharge line 167, negative pressure lower than atmospheric pressure is formed inside the suction tank 140.

The chemical solution flowing into the suction tank 140 is filtered by a filter unit 144 and then discharged through a drain unit 146 (S15), and a chemical fume and gas generated in the suction tank 140 are discharged through the discharge line 167 (S16). In this case, sludge with large particles is filtered by a filter 144a at an upper side, and sludge with small particles is filtered by a filter 144a at a lower side. In addition, since a bottom surface of a suction tank body 141 is inclined toward a center thereof such that the chemical solution is collected, the chemical solution can be smoothly discharged through the drain unit 146. In addition, since the chemical fume and gas are discharged through the discharge line 167, negative pressure may be maintained inside the suction tank 140.

An overflow detection unit 163 detects whether the chemical solution overflows in the suction tank 140 (S17). In this case, when the filter unit 144 is clogged by sludge, the chemical solution may overflow to an upper side of the suction tank body 141. The overflowing chemical solution is discharged to the drain unit 146 through an overflow line 161.

When the overflow detection unit 163 detects that the chemical solution overflows in the suction tank 140 (S18), a control unit 170 controls the spray nozzles 126 and 127 to stop the supply of the chemical solution to the cup housing 112 (S19). In addition, the control unit 170 controls an alarm unit 165 to generate an alarm. When an alarm sounds in the alarm unit 165, an operator opens the suction tank 140 and then replaces or cleans the filter unit 144.

After a substrate processing process is ended, the ejector 150 may be driven for a preset time. For example, after the substrate processing process is ended, the ejector 150 is driven for about 3 to 5 minutes. Therefore, sludge and a chemical solution remaining in the suction nozzle 125 and the flow line 130 are completely discharged to the suction tank 140, the substrate W can be prevented from being contaminated due to the chemical solution falling from the suction nozzle 125.

According to the present invention, since an ejector is installed on a flow line, a suction nozzle can be formed to be expanded, and the size of the ejector can be increased. Accordingly, it is possible to prevent the suction nozzle and the ejector from being clogged by sludge.

In addition, according to the present invention, since the ejector is driven for a preset time after a substrate processing process is ended, it is possible to prevent a chemical solution from remaining in the suction nozzle. Accordingly, it is possible to prevent a substrate from being contaminated by the chemical solution remaining in the suction nozzle.

While the present invention has been described with reference to embodiments shown in the drawings, these should be considered in a descriptive sense only, and it will be understood by those skilled in the art that various alterations and other equivalent embodiments may be made.

Accordingly, the true scope of protection of the present invention should be defined only by the appended claims.

What is claimed is:

1. A wafer processing apparatus comprising:
   a suction nozzle that suctions sludge from a cup housing;
   a flow line connected to the suction nozzle such that the sludge and a chemical solution flow therein;
   a suction tank connected to the flow line such that the sludge and the chemical solution flow thereto; and
   an ejector installed on a flow line and that generates suction pressure in the suction nozzle and the flow line, wherein
   the suction tank includes:
      a suction tank body; and
      a filter disposed inside the suction tank body and that filters the sludge discharged from the flowline.

2. The wafer processing apparatus of claim 1, wherein the ejector includes:
   an ejector body into which the sludge and the chemical solution suctioned into the flow line flow; and
   a gas supply unit connected to the ejector body and that supplies a gas to the ejector body.

3. The wafer processing apparatus of claim 1, wherein the suction tank further includes:
   a drain connected to the suction tank body and that discharges the chemical solution filtered by the filter.

4. The wafer processing apparatus of claim 3, wherein:
   the filter is one of a plurality of filters stacked between the flow line and the drain; and
   the plurality of filters have meshes which become smaller toward the drain.

5. The wafer processing apparatus of claim 3, further comprising an overflow line connected to the suction tank body and the drain.

6. The wafer processing apparatus of claim 5, wherein the overflow line is connected to a portion above the filter in the suction tank.

7. The wafer processing apparatus of claim 5, further comprising an overflow detector that detects that the chemical solution of the suction tank body flows into the overflow line.

8. The wafer processing apparatus of claim 1, further comprising a discharge line connected to the suction tank and that discharges a chemical fume and a gas from the suction tank.

9. The wafer processing apparatus of claim 1, further comprising a spray nozzle that sprays the chemical solution onto a substrate in the cup housing,
   wherein, when the spray nozzle sprays the chemical solution onto the substrate, the suction nozzle suctions the sludge floating in the chemical solution.

10. The wafer processing apparatus of claim 1, further comprising a controller wherein, after a substrate processing process is ended, the ejector is controlled to generate suction pressure in the suction nozzle and the flow line for a preset time.

* * * * *